US012770681B2

(12) United States Patent

Erbagci et al.

(10) Patent No.: US 12,770,681 B2

(45) Date of Patent: Oct. 20, 2026

(54) BACKSIDE METAL TRACK CAPACITANCE FOR WRITE ASSIST

(71) Applicant: NVIDIA Corporation, Santa Clara, CA (US)

(72) Inventors: Cagri Erbagci, Pittsburgh, PA (US); Lalit Gupta, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 82 days.

(21) Appl. No.: 18/768,938

(22) Filed: Jul. 10, 2024

(65) Prior Publication Data

US 2026/0018207 A1 Jan. 15, 2026

(51) Int. Cl.

| | |
|---|---|
| ***G11C 11/419*** | (2006.01) |
| ***G11C 11/412*** | (2006.01) |
| ***H10B 10/00*** | (2023.01) |
| ***H10D 84/01*** | (2025.01) |
| ***H10D 84/03*** | (2025.01) |
| ***H10D 84/80*** | (2025.01) |
| ***H10D 84/83*** | (2025.01) |

(52) U.S. Cl.

CPC .......... *G11C 11/419* (2013.01); *G11C 11/412* (2013.01); *H10B 10/12* (2023.02); *H10D 84/0144* (2025.01); *H10D 84/038* (2025.01); *H10D 84/811* (2025.01); *H10D 84/83* (2025.01)

(58) Field of Classification Search

CPC .............................. G11C 11/419; G11C 11/41

See application file for complete search history.

(56) References Cited

U.S. PATENT DOCUMENTS

| | | | | |
|---|---|---|---|---|
| 2009/0128183 | A1* | 5/2009 | Toffoli | H01L 22/34<br>324/750.03 |
| 2015/0137330 | A1* | 5/2015 | Taibi | H01L 25/0657<br>257/622 |
| 2022/0262723 | A1* | 8/2022 | Bao | H01L 21/76885 |
| 2023/0115339 | A1* | 4/2023 | Cui | G11C 13/0038<br>365/163 |
| 2025/0201281 | A1* | 6/2025 | Akkaya | G11C 5/145 |

* cited by examiner

*Primary Examiner* — Amir Zarabian

*Assistant Examiner* — Anthony Thinh Tang

(57) ABSTRACT

An electrical device including a substrate having a frontside surface and a backside surface and a back-side insulating layer with back-side metal tracks therein, the back-side insulating layer located on the backside surface. At least portions of an adjacent pair of the back-side metal tracks generate a back-side boost capacitance connected between a first node coupled to a gate contact of a transistor of a write driver circuit of the electrical device and a second node coupled to a drain contact of the transistor and a circuit ground. Also disclosed is method manufacturing the electrical device.

20 Claims, 5 Drawing Sheets

BACKSIDE METAL TRACK CAPACITANCE FOR WRITE ASSIST

TECHNICAL FIELD

This application is directed, in general, to electrical devices having boost capacitance for memory write assistance, and in particular, devices having a boost capacitor generated from portions of back-side metal tracks, and, a method of manufacturing such devices.

BACKGROUND

Some approaches to write-assist technology rely on the use of a coupling capacitance provided by boost capacitors formed from front-side metal tracks (also commonly referred to as wires or lines). However, design rules to support ever-decreasing technology nodes, leading to an increased density of transistors in electrical circuits, can also result in a reduction in the number and size of front-side metal tracks available to form boost capacitors in a standard cell pitch.

SUMMARY

One aspect provides an electrical device. The device includes a substrate having a frontside surface and a backside surface and a back-side insulating layer with back-side metal tracks therein, the back-side insulating layer located on the backside surface. At least portions of an adjacent pair of the back-side metal tracks generate a back-side boost capacitance connected between a first node coupled to a gate contact of a transistor of a write driver circuit of the electrical device and a second node coupled to a drain contact of the transistor and a circuit ground.

Another aspect is a method of manufacturing an electrical device. The method includes providing a substrate having a frontside surface and a backside surface and forming a back-side insulating layer on the backside surface. The method includes forming back-side metal tracks in the back-side insulating layer, where at least portions of an adjacent pair of the back-side metal tracks to generate a back-side boost capacitance. The method includes connecting one of the metal tracks between a first node coupled to a gate contact of a transistor of a write driver circuit of the electrical device and connecting a second one of the metal tracks to a second node coupled to a drain contact of the transistor and a circuit ground.

BRIEF DESCRIPTION

Figure 1:
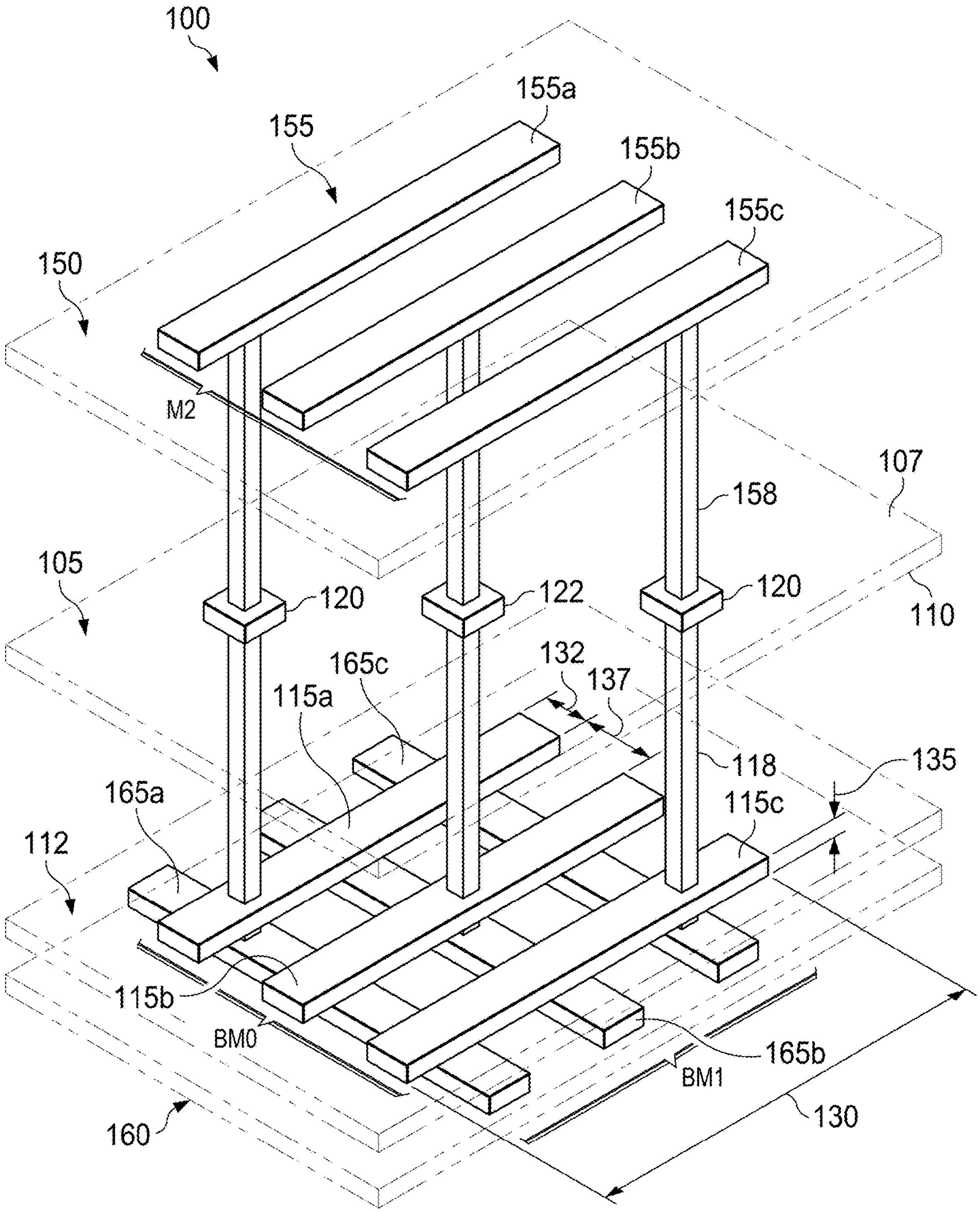
Figure 2:
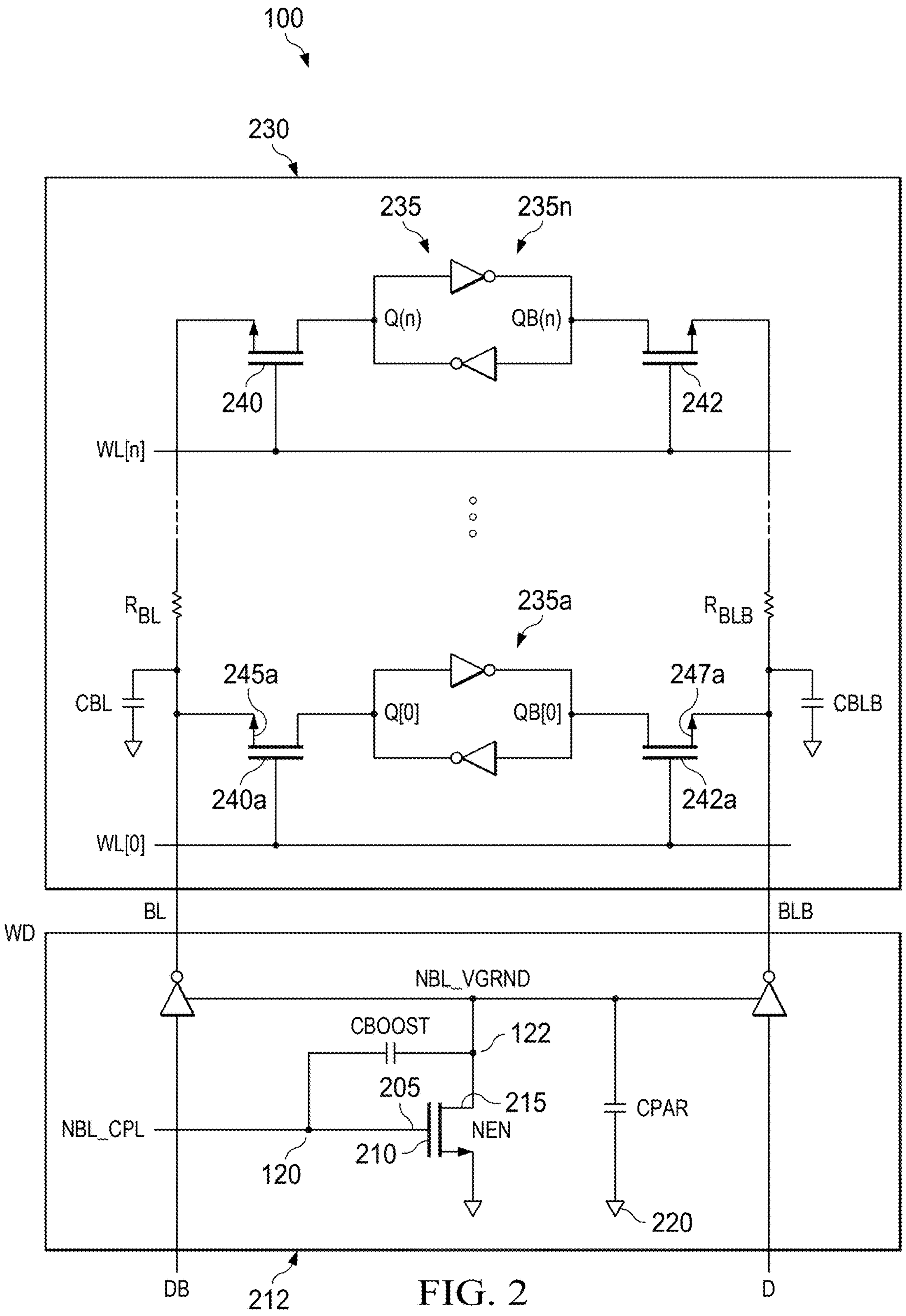
Figure 3A:
Figure 3B:
Figure 3C:
Figure 3D:
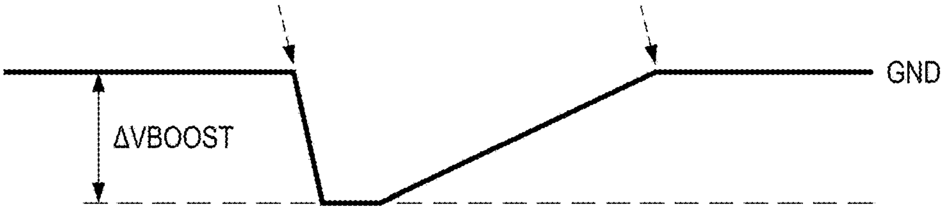
Figure 3E:
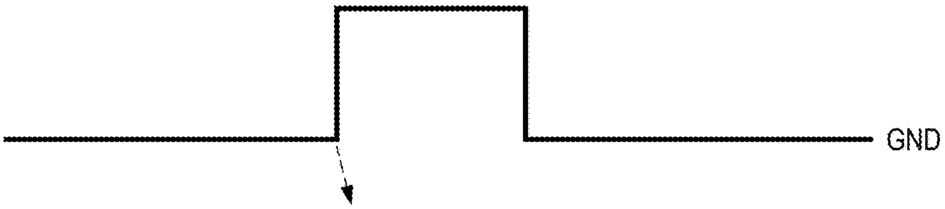
Figure 3F:
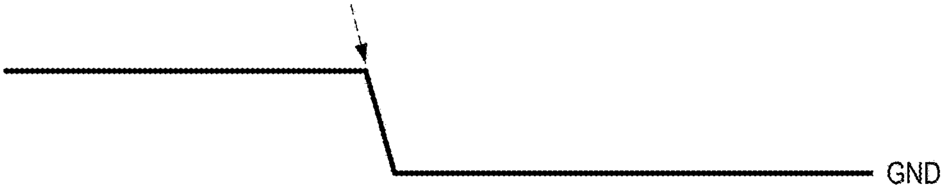
Figure 4:
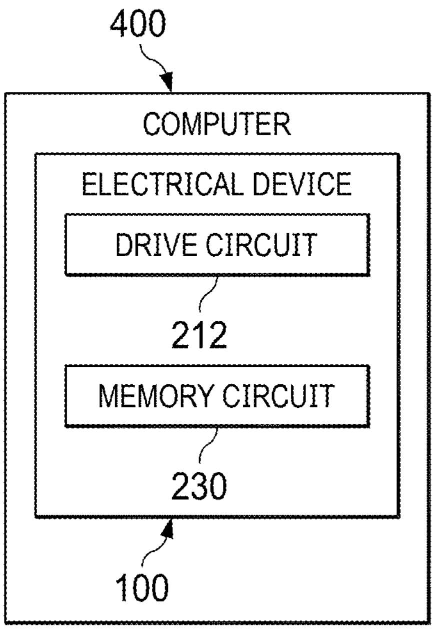
Figure 5:
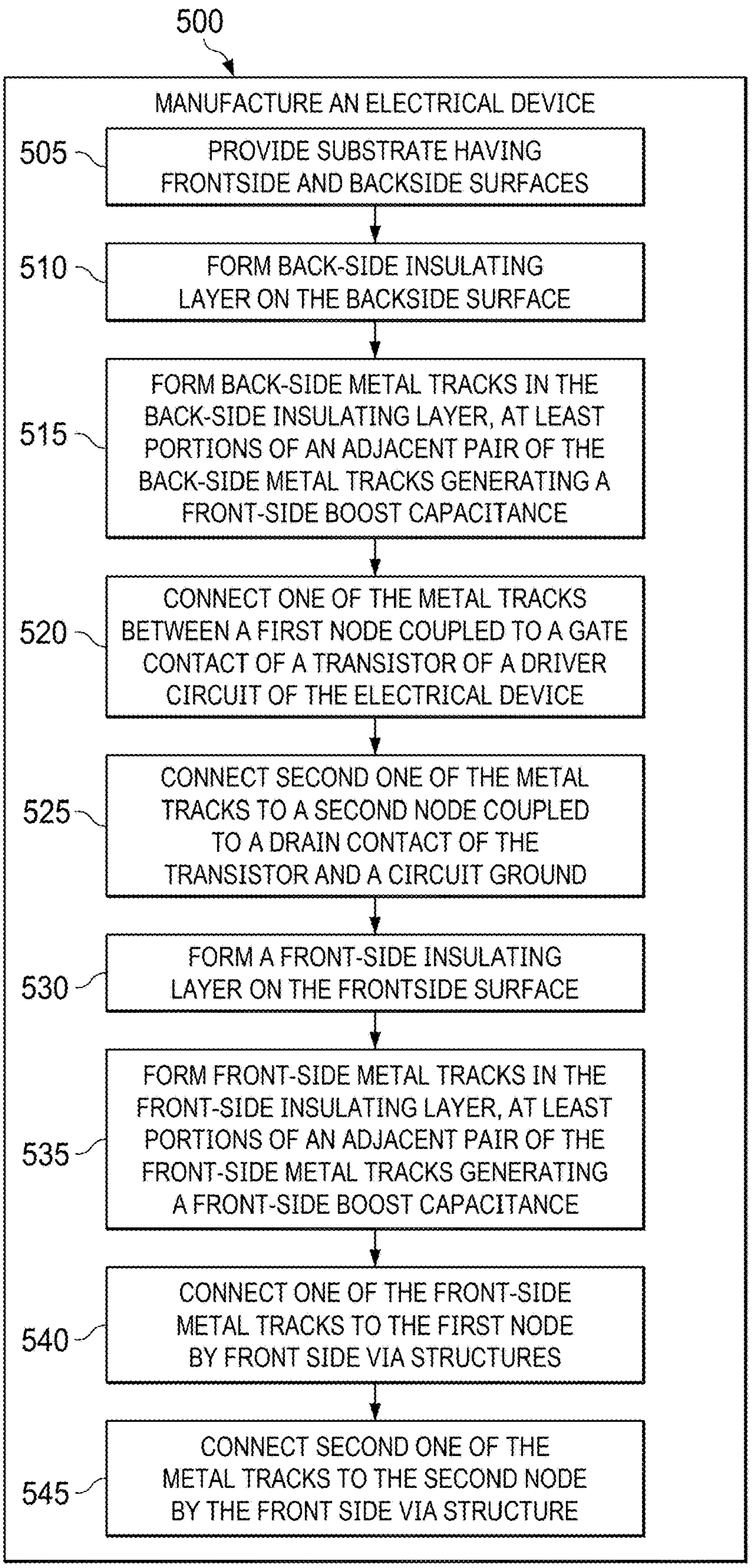

Reference is now made to the following descriptions taken in conjunction with the accompanying drawings, in which:

FIG. 1 presents an exploded perspective view of an example embodiment of a electrical device of the disclosure;

FIG. 2 presents a schematic view of an example write assist electrical circuit of the electrical device of the disclosure;

FIGS. 3*a-f* present schematic views showing changes in voltages at different stages of operation of the electrical circuit shown in FIG. 2;

FIG. 4 presents a block diagram of a computer having one or more electrical circuits that include any embodiments of the electrical device such as disclosed in the context of FIGS. 1-3; and FIG. 5 presents a flow diagram of a method of manufacturing the electrical device including any embodiments of the device disclosed in the context of FIGS. 1-4.

DETAILED DESCRIPTION

Although design rules to place back-side metal tracks for power delivery help reduce or eliminate the use of front-side metal tracks for power delivery, the number of such front-side metal tracks available to form boost capacitors may still be constrained due to the dense global and local interconnects and their shielding. Whenever possible, this can be mitigated by decreasing the width of interconnects to make room for the required boost capacitors or use higher levels of front-side metal tracks, but, potentially at the expense of degraded performance, or, causing the need to use Metal Oxide Substrate (MOS) boost capacitors with extra area overhead costs, without violating design rules that, e.g., call for at most one or two of front-side metal layers.

Embodiments of the disclosure follow from our idea to use portions of at least two adjacent back-side metal tracks to provide at least part of the coupling capacitance for write assistance. A feature of this idea is increasing the coupling capacitance to enhance write performance without necessarily modifying the metal stacks in a memory circuit design. Is it not obvious that back-side metal tracks could be used to form boost capacitors provide at least a portion of such coupling capacitance because this at appears to violate design rules that specifically dictate that back-side metal tracks to be used for power delivery. Surprisingly, however, we discovered that by using just a portion of the back-side metal tracks to provide at least a portion of the required capacitance, we could reduce reliance on boost capacitors being provided by front-side metal tracks, and thereby mitigate potential degraded performance, the need to use MOS boost capacitors or larger numbers of front-side layers. That is, while using some back-side metal tracks for non-power uses at first appears to violate a design rule, by using just a portion of the back-side metal tracks to provide boost capacitors, the remaining back-side metal tracks can still provide the device power as required under the design rules.

It was also surprising that using back-side metal tracks designed to carry power could be repurposed to provide substantial coupling capacitance for write assistance because such tracks are designed as power delivery structures. For instance, the back-side metal tracks designed to carry power are thinner than that desired to provide capacitance between adjacent pairs of back-side metal tracks, because the spacing between adjacent tracks is smaller than desired for maximizing the capacitance between the tracks. Nevertheless, as further disclosed herein, portions of such back-side metal tracks were surprisingly able make a substantial contribution towards coupling capacitance generation for write assistance. Having portions of back-side metal tracks serve as boost capacitors in turn can free-up some portions of front-side metal tracks to give more room for top level routing or eliminate upper level front-side metal tracks (e.g., one or more of front-side metal level 4, M4, through metal level 6, M6, in some embodiments) thereby reducing masking and other fabrication costs, or avoiding the need to take measures to introduce blockage to avoid coupling between such higher metal levels.

One embodiment of the disclosure is an electrical device. FIG. 1 presents an exploded perspective view of an example embodiment of an electrical device 100 of the disclosure that can include two or more back-side metal tracks arranged adjacently to provide a boost capacitance for write assistance. FIG. 2 presents a schematic view of an example electrical circuit diagram of the electrical device 100 of the disclosure that includes back-side metal traces that generates part of a write-assist coupling capacitance (Cboost). FIG. 3 presents a schematic view showing changes in voltages at different stages of operation of an embodiment of the electrical circuit such as shown in FIG. 2.

With continuing reference to FIGS. 1-3 through-out, in some embodiments, the electrical device 100 includes a substrate 105 (e.g., a semiconductor substrate such as silicon dies or other die substrates familiar to those skilled in the pertinent art) having a frontside surface 107 and a backside surface 110. The device further includes a back-side insulating layer 112 (e.g., inorganic material layers such as silicon nitride or silicon dioxide, or organic polymer layers or combinations thereof as familiar to those skilled in the pertinent art) with back-side metal tracks (generally any back-side metal tracks, such as, but not limited to, back-side metal tracks 115 or 165, e.g., copper or other types of low electrical resistivity metal tracks as familiar to those skilled in the pertinent art) therein, the back-side insulating layer located on the backside surface 110. At least portions of an adjacent pair of the back-side metal tracks (e.g., metal track portions 115*a*, 115*b* or 115*b*, 115*c*) generate a back-side boost capacitance connected (e.g., by a via structures 118) between a first node 120 coupled to a gate contact 205 of a transistor 210 (e.g., an NMOS transistor) of a write driver circuit 212 of the electrical device, and a second node 122 coupled to a drain contact 215 of the transistor 210 and a circuit ground 220.

In some embodiments, some or all of structural parameters of the length, width, thickness and spacing of the portions of the back-side metal tracks and the insulating layer in which these tracks are in, may be specified by the design rules of a foundry. Therefore the choices on where and how to structure the back-side metal tracks to generate the back-side boost capacitance may be limited. In other embodiments, some or all of these structural parameters may be part of new design rules that consider and optimize the generation of back-side boost capacitance for write assistance by maximizing the coupling capacitance between selected portions of back-side metal tracks.

Non-limiting examples of such structural parameters are as follows. In some device embodiments, the portions of the back-side metal tracks (generally, portions 115) have a length 130 value in a range from 5 to 10 μm. In some embodiments, the portions of the back-side metal tracks have a width 132 value in a range from 20 to 100 nm. In some embodiments, the portions of the back-side metal tracks 115 have a thickness 135 value in a range from 10 to 50 nm. In some embodiments, the adjacent pair of portions of the back-side metal tracks (e.g., metal track portions 115*a*, 115*b* or 115*b*, 115*c*) are separated by a gap 137 distance value in a range from 15 to 250 nm. In some embodiments, the back-side boost capacitance generated is a value in a range from 0.5 to 10 femtoFarads (fF).

As illustrated in FIG. 1, in some embodiments, the adjacent pair of the portions of the back-side metal tracks can be located in a first back-side insulating layer 112 (BM0) that is directly adjacent to the backside surface 110 of the substrate 105. In other embodiments, the wherein the adjacent pair of back-side metal tracks (e.g., metal track portions 165*a*, 165*b* or 165*b*, 165*c*) can be located in a second back-side insulating layer 160 (e.g., BM1) that is on a first back-side insulating layer 112 (BM0) that in turn is on the backside surface 110 of the substrate 105.

In still other embodiments, the adjacent pair of the portions of the back-side metal tracks can include portions of the back-side metal tracks (BM0) located in a first back-side insulating layer 112, and additionally, the portions of the back-side metal tracks (BM1) can be located in a second back-side insulating layer 160. Based on the present disclosure one skilled in the pertinent art would understand how further portions of the back-side metal tracks (BM2, BM3 etc.) could alternatively or additionally be located in third, fourth or further away back-layer insulating layers. For instance, the adjacent pair of back-side metal tracks (BM2, BM3 etc.) can be located in third, fourth etc. back-side insulating layers, that is on a second, third etc. back-side insulating layer that in turn is on the first, second insulating layers on the backside surface of the substrate. The alternating back-side metal tracks of BM0, BM1, etc. located in adjacent back-side insulating layers can be arranged to have their lengths running orthogonal to each other, such as illustrated in FIG. 1.

As also illustrated in FIG. 1, embodiments of device 100 can further include a front-side insulating layer (generally layer 150) with front-side metal tracks (generally tracks 155) therein, the front-side insulating layer located on the frontside surface 107 of the substrate 105. At least portions of an adjacent pair of the front-side metal tracks (e.g., metal track portions 155*a*, 155*b* or 155*b*, 155*c*) can be connected (by via structures 158) to generate a front-side boost capacitance, where one of the front-side metal tracks is connected to the first node 120 and a second one of the front-side metal tracks is connected to the second node 122. In some such embodiments, the adjacent pair of front-side metal tracks (e.g., M2) can be located in a second front-side insulating layer that is on a first front-side insulating layer that in turn is directly on the frontside surface 107. In other embodiments, additionally or alternatively, the adjacent pair of front-side metal tracks (e.g., M1, M3, M4 etc.) can be located any other front-side insulating layers of the device (e.g., first, third, fourth etc. front-side insulating layers). In still other embodiments a portion of boost capacitors can be additionally or alternatively provided by front-side MOS boost capacitors.

In some such embodiments, e.g., the front-side boost capacitance can be a value in a range from 0.5 to 10 femtoFarads (fF) which can correspond to a portion of a total boost capacitance generated for a write driver circuit (e.g., circuit 212, FIG. 2) of the device as further described below. For instance, in some embodiments, the back-side boost capacitance can equal to from 10 to 100 percent of a total boost capacitance (Cboost) generated for the write driver circuit 212 and the balance can be generated from the front-side boost capacitance. E.g., in some such embodiments, only the back-side metal track portions can be used to generate 100 percent of Cboost.

As illustrated in FIG. 2, embodiments of the device 100 can further includes one or more memory circuits (e.g., memory circuit 230). Each memory circuit can include an array of bit cells (generally bit cells 235. e.g., any SRAM bit cell array). The bit cells can be connected to a bit-line (BL) and complement bitline (BLN), and, connected to have unique addressable word lines (WL(0) . . . (WL(n)) as familiar to those skilled in the pertinent art. A source of one transistor (generally transistor 240, e.g., NMOS transistors) of each one of the bit cells (e.g., source 245*a* of transistor 242*a* of bit cell 235*a*) can be connected to receive a negative bit-line bit line voltage (nbl_cpl) from the write driver circuit 212. Another source of another transistor (generally transistor 242, e.g., NMOS transistors) of the same one bit cell (e.g., source 247*a* of transistor 242*a* of the same bit cell 235*a*) can be connected to receive a negative bit-line complement voltage from the write driver circuit.

In some embodiments of the memory circuit 230 each of the bit cells 235 can be, e.g., a six (6T), an eight-transistor circuit cells (8T), or other multi-transistor circuit cells and one skilled in the pertinent art would understand how other types of bit cells could be used additionally or alternatively. In some embodiments of the memory circuit 230 the transistors of the electrical circuit can be gate-all around (GAA) transistors, but one skilled in the pertinent art would understand how other types of transistors could be used additionally or alternatively.

Abbreviations and aspects of the operation of the example electrical circuit presented in FIGS. 2-3 are disclosed below.

The terms WL(0) . . . . WL(n) refer to word lines, e.g., closest and farthest way from a write driver circuit 212 (WD), respectively.

The terms BL refers to a bit-line and BLB refers to the complement of the BL.

The terms CBL and Cbl refer to a capacitance of a bit-line (BL) and CBLB or Cblb refer to a capacitance of the complement of the BL.

The terms RBL refers to a resistance of a bit line BL and, RBLB a resistance of the complement of the BL.

The terms Q(n) and QB(n) refer to the bit and complement bit (bitb) nodes of a bit cell 235. Writing a "1" in a bit cell means making Q(bit) equal to logic −1, and QB(bitb) equal to logic −0.

The term Nen refers to an NMOS transistor device of the write driver circuit.

The term Cboost refers to a coupling capacitance generated by boost capacitors.

The term nbl_cpl refers to a signal that couples with nbl_vgrnd. When write assist is active, nbl_cpl makes a low transition to cause a voltage drop (e.g., ΔVboost; FIG. 3). E.g., as illustrated in FIG. 3, to avoid loss through the NMOS (Nen) device, nbl_cpl is in an OFF state during coupling, and until the write operation is successfully done on a bit cell.

The term nbl_vgrnd refers to a low power source of inverters of the write driver's circuit (WD) electrical ground (GND) at idle, and, it is connected to the NMOS drain (Nen; FIG. 3). When write assist is not active (e.g., nlb_cpl=1), Nen is active and nbl_vgrnd is tied to GND. When write assist is active, a negative voltage is introduced at the inverter low power supply, through the coupling with nbl_cpl due to its low transition, which also makes Nen to go an OFF state.

The term Cpar refers to the total waste or parasitic capacitance on the nbl_vgrnd with respect to ground (GND). For optimal boost voltage generation, there should only be the Cboost that is the coupling capacitance associated with nbl_cpl. But since nbl_vgrnd has Cpar (the other terminal is with respect to GND) in addition to Cboost, the charge will be divided, and the actual boost voltage generated, ΔVboost, will be less than optimal. This can be illustrated by the following equation (1):

$$\Delta Vboost = \frac{VDD * Cboost}{Cboost + Cpar + Cbl/b} \quad (1)$$

$$Cpar = \text{Cnbl\_vgrnd, wire} + Cinv + CNen$$

where Cbl/b is the bit-line capacitance, corresponding to a capacitance of a bit-line and a capacitance of the complement of the bit-line, Cnbl_vgrnd, wire is total capacitance with respect to GND, Cinv is a parasitic capacitance of the MOS inverters of the write driver circuit 212, and CNen is a parasitic drain capacitance of the Nen (NMOS). Because Cpar and Cbl/b in the denominator of the equation are non-zero, the generated boost voltage ΔVboost is less than if Cboost was the only coupling capacitance associated with nbl_cpl. nbl_vgrnd The term D in FIG. 3*a* refers to data input to be written into a bit cell.

The term WE in FIG. 3*b* refers to a write enable signal that tells the circuit when to start writing, by, controlling nbl_cpl signal and WL activation.

In FIG. 3*c*, nbl_cpl refers to the signal that activates the write assist; a decrease in nbl_cpl turns off Nen to thereby create a negative boost voltage on nbl_vgrnd.

In FIG. 3*d*, nbl_vgrnd refers to a low supply voltage of WBL/B drivers and ΔVboost refers to the amount of boost voltage generated to enable a bit cell NMOS transistor (e.g., transistors 240, 242) to flip at a minimized voltage of operation (Vmin).

In FIG. 3*e*, WL(n) and QB(n) in FIG. 3*f* refer to an nth word line and bit-node of an nth the bit cell.

The TABLE gives a hypothetical example of how write-assistance can be facilitated through the use of back-side metal traces to generate coupling capacitance that contributes to Cboost.

| Metal Layer | nbl_vgrnd coupling capacitance | nbl_vgmd parasitic capacitance | Total nbl_vgrnd capacitance | Percentage of capacitance |
|---|---|---|---|---|
| BM0 + M2 | 2X fF | 0.5X fF | 2.5X fF | 80% |
| M2 | X fF | 0.25X fF | 1.25X fF | 80% |

In the TABLE the nbl_vgrnd coupling capacitance corresponds to Cboost and nbl_vgrnd corresponds to Cnbl_vgrnd, wire in equation (1). In this analysis it is assumed that there are no other contributors of parasitic capacitance (e.g., Cinc and CNen both equal to zero). As non-limiting examples, in some embodiments, X can be value in a range from 0.5 to 10 femtoFarads (fF). Based on the present disclosure, one skilled in the pertinent art would understand how the values of X would depend on metal track length, width, thickness and spacing, fabrication processing parameters and the number of available metal tracks, for a particular bit cell row size.

In the TABLE row labeled "M2", the sole source of coupling capacitance is assumed to come from front-side metal trace located in a second front-side insulating layer on the frontside surface of a substrate (e.g., front-side metal traces M2, front-side insulating layer 150, FIG. 1). Although the total capacitance generated is 1.25X fF, only X fF (80%) is available as coupling capacitance for Cboost, and the remaining 20% is nbl_vgrnd parasitic capacitance.

In the TABLE row labeled "BM0+M2", two sources of coupling capacitance are assumed to come from M2 and from back-side metal track portions located in a back-side insulating layer (e.g., BM0) on the backside surface of a substrate (e.g., back-side insulating layer 112, FIG. 1). Now the total capacitance generated, 2.5X fF, and 2X fF (80%), is available as coupling capacitance for Cboost, as nbl_vgrnd parasitic capacitance. Thus, there is an almost doubling of the coupling capacitance with a similar efficiency (e.g., 80%). Consequently, in this example, adding more coupling capacitance generated from back-side metal track portions effectively increase the total coupling capacitance, changing the scaling factor (F) from 1*x* to 2*x*. This approach can help in tuning the electrical properties of the IC to meet specific performance criteria, such as increasing crosstalk or adjusting boost at a bit cell to provide write assistance with a lower minimum voltage (Vmin) requirement, as further explained in the context of FIG. 3*d*.

Based on the present disclosure one skilled in the pertinent arts would understand that the coupling capacitance contribution from back-side metal tracks could be less or more than 2X, depending on the process DRC and the different BM usage along with BM0. In the TABLE, the parasitic and the total capacitance are calculated for this specific case, using only BM0 from the back side.

As noted herein, in some embodiments further coupling capacitance could be increased by adding back-side metal traces from other insulating layers (e.g., BM0, BM1, BM2 etc.) to provide a suitable Cboost, depending on circuit requirements, although the individual contributions of coupling capacitance from deeper layers such as BM1, BM2 could be less than from BM0. For instance, in some embodiments, a design rule check (DRC), may impose a requirement for the fabrication of metal tracks for power delivery with increasingly greater widths (e.g., a greater minimum width) for farther away metal layers (e.g., BM3, BM4, BM5 etc.). If such metal tracks have a greater width, the minimum spacing increases per the DRC, and therefore the contribution of coupling capacitance from portions of metal tracks in such farther layers will be less as compared to analogous metal tracks in nearer layers (e.g., BM0, BM1, BM2).

One skilled in the pertinent art would understand how such structural parameters of the metal track portions would be adjusted to accommodate a particular device technology node and its design rules for the electronic device's manufacture.

For instance, consider a hypothetical technology node embodiment of the device 100 with a memory circuit 230 that includes a 64 row SRAM bit cell array (e.g., FIGS. 2, n=0 to 63), specifying a back-side metal track pitch of 200 nm, and width-to-thickness aspect ratio set to a range of 0.4:1 to 0.6:1 (e.g., 0.5:1 in the present example) to reduce electrical resistance. In some such embodiments, the width 132 and gap 137 between adjacent backside metal tracks could be set to 80 nm and 120 nm respectively, and the thickness 135 of the metal tracks set to 40 mm. To generate a suitable target back-side boost capacitance for write assistance, the length of the portions of a pair of adjacent metal tracks (e.g., from some embodiments a length 130 in a range from 5 to 10 μm) would be adjusted accordingly. In other such embodiments, where three or four adjacent metal track portions are used to generate the back-side boost capacitance, then shorter lengths of the portions of a pair of adjacent metal tracks could be used as compared to using two adjacent pairs to generate the target back-side boost capacitance. Or, in still other embodiments, pairs of portions of adjacent metal tracks from different backside insulating layers 115, 160 could be combined to generate the target back-side boost capacitance using still shorter lengths or different lengths of metal track portions. Based on the present disclosure one skilled in the pertinent art would understand that the number of metal tracks available can be defined by design rule minimum width and spacing, and bit-cell size and how the back-side metal track length and availability would defined by the bit-cell array size for a particular design rule.

FIG. 4 presents a block diagram of a computer 400 that includes any embodiments of the electrical device 100 and manufactured as disclosed herein. For instance, as illustrated, the electrical device 100 with the write driver circuit 212 and the memory circuit 230 can be part of a computer 400.

Another embodiment of the disclosure is a method of method of manufacturing an electrical device. FIG. 5 presents flow diagram of a method (500) of manufacturing an electrical device, such as any of the example devices 100 embodiments disclosed in the context of FIGS. 1-4.

With continuing reference to FIGS. 1-5 throughout, the method 500 includes providing (step 505) a substrate 105 having a frontside surface 107 and a backside surface 110, and form forming (step 510) a back-side insulating layer 112 or 160 on the backside surface 110. The method further includes forming (step 515) back-side metal tracks (generally 115 and/or 165) in the back-side insulating layer. At least portions of an adjacent pair of the back-side metal tracks (e.g., metal track portions 115*a*, 115*b* or 115*b*, 115*c* or 165*a*, 165*b* or 165*b*, 165*c*) generate a back-side boost capacitance. The method further includes connecting (step 520) one of the metal tracks between a first node 120 coupled to a gate contact 205 of a transistor 210 (e.g., an NMOS transistor) of a write driver circuit 212 of the electrical device 100, and, connecting (step 525) a second one of the metal tracks to a second node 122 coupled to a drain contact 215 of the transistor 210 and a circuit ground 220.

In some such embodiments of the method 500, the back-side insulating layer formed in step 510 can be a first back-side insulating layer 112 that is directly adjacent to the backside surface 110 of the substrate 105. In some such embodiments, the back-side insulating layer is a second back-side insulating layer 160 that is on a first back-side insulating layer 112. In still other embodiment the back-side insulating layer formed in step 510 can be a third or fourth of back-side insulating layer, and, the back-side metal tracks form therein in step 515 (e.g., BM0, BM1, BM2, BM3, etc.).

Any such embodiments of the method 500 can include forming (step 530) a front-side insulating layer 150 on the frontside surface 107 of the substrate 105, and forming (step 535) front-side metal tracks (generally 155) in the front-side insulating layer. At least portions of an adjacent pair of the front-side metal tracks (e.g., metal track portions 155*a*, 155*b* or 155*b*, 155*c*) generate a front-side boost capacitance, including connecting (step 540) one of the front-side metal tracks to the first node 120 by front side via structures 158 and connecting (step 545) a second one of the metal tracks to the second node 122 by the front side via structure 158.

Those skilled in the pertinent art would be familiar with how to form insulating layers of substrate surfaces, metal layer deposition and patterning techniques, and via formation processes, to form and connect the metal track portions.

What is claimed is:

1. An electrical device, the electrical device comprising:

a substrate having a frontside surface and a backside surface; and a back-side insulating layer with back-side metal tracks therein, the back-side insulating layer located on the backside surface, wherein at least portions of an adjacent pair of the back-side metal tracks generate a back-side boost capacitance connected between a first node coupled to a gate contact of a transistor of a write driver circuit of the electrical device and a second node coupled to a drain contact of the transistor and a circuit ground.

2. The device of claim 1, wherein the portions of the back-side metal tracks have a length value in a range from 5 to 10 μm.

3. The device of claim 1, wherein the portions of the back-side metal tracks have a width value in a range from 20 to 100 nm.

4. The device of claim 1, wherein the portions of the back-side metal tracks have a thickness value in a range from 10 to 50 nm.

5. The device of claim 1, wherein the adjacent pair of portions of the back-side metal tracks are separated by a gap distance value in a range from 15 to 250 nm.

6. The device of claim 1, wherein the back-side boost capacitance is a value in a range from 0.5 to 10 femtoFarads.

7. The device of claim 1, wherein the adjacent pair of the portions of the back-side metal tracks are located in a first back-side insulating layer that is directly adjacent to the backside surface of the substrate.

8. The device of claim 1, wherein the adjacent pair of back-side metal tracks are located in a second back-side insulating layer that is on a first back-side insulating layer that in turn is on the backside surface of the substrate.

9. The device of claim 1, further including a front-side insulating layer with front-side metal tracks therein, the front-side insulating layer located on the frontside surface, wherein at least portions of an adjacent pair of the front-side metal tracks generate a front-side boost capacitance connected between to the first node and a second one of the front-side metal tracks is connected to the second node, or, a front-side MOS capacitor generates the front-side boost capacitance.

10. The device of claim 9, wherein the adjacent pair of front-side metal tracks are located in a second front-side insulating layer on the frontside surface.

11. The device of claim 9, wherein the front-side boost capacitance is a value in a range from 0.5 to 10 femtoFarads.

12. The device of claim 1, wherein the back-side boost capacitance is equal to 10 to 100 percent of a total boost capacitance generated for the write driver circuit.

13. The device of claim 1, further including a memory circuit, the memory circuit including an array of bit cells, the bit cells connected to a bit-line and complement bitline, and connected to have unique addressable word lines, wherein a source of one transistor of each one of the bit cells is connected to receive a negative bit-line bit line voltage from the write driver circuit and another source of another transistor of the same one bit cell is connected to receive a negative bit-line complement voltage from the write driver circuit.

14. The device of claim 13, wherein each of the bit cells are multi-transistor circuit cells.

15. The device of claim 13, wherein the transistors of the electrical circuit are gate-all around transistors.

16. The device of claim 13, wherein the electrical device with the write driver circuit and the memory circuit is part of a computer.

17. A method of manufacturing an electrical device, comprising:

providing a substrate having a frontside surface and a backside surface;

forming a back-side insulating layer on the backside surface;

forming back-side metal tracks in the back-side insulating layer, wherein at least portions of an adjacent pair of the back-side metal tracks to generate a back-side boost capacitance;

connecting one of the metal tracks between a first node coupled to a gate contact of a transistor of a write driver circuit of the electrical device; and connecting a second one of the metal tracks to a second node coupled to a drain contact of the transistor and a circuit ground.

18. The method of claim 17, wherein the back-side insulating layer is a first back-side insulating layer that is directly adjacent to the backside surface of the substrate.

19. The method of claim 17, wherein the back-side insulating layer is a second back-side insulating layer that is on a first back-side insulating layer that in turn is on the backside surface of the substrate.

20. The method of claim 17, further including:

forming a front-side insulating layer on the frontside surface;

forming front-side metal tracks in the front-side insulating layer, wherein at least portions of an adjacent pair of the front-side metal tracks generate a front-side boost capacitance;

connecting one of the front-side metal tracks to the first node by front side via structures; and connecting a second one of the metal tracks to the second node by the front side via structure.

* * * * *